US007286228B2

United States Patent
Oh

(10) Patent No.: US 7,286,228 B2
(45) Date of Patent: Oct. 23, 2007

(54) METHOD AND APPARATUS FOR MEASURING CIRCULARLY POLARIZED ROTATING ELECTROMAGNETIC WAVE USING MAGNETIC FIELD

(76) Inventor: Hung Kuk Oh, 110-1101 Geonyoung Apt. 132 Imae-dong, Bundang-gu, Seongnam-City, Kyungki-do (KR) 463-731

( * ) Notice: Subject to any disclaimer, the term of this patent is extended or adjusted under 35 U.S.C. 154(b) by 104 days.

(21) Appl. No.: 11/171,229

(22) Filed: Jul. 1, 2005

(65) Prior Publication Data
US 2007/0007940 A1   Jan. 11, 2007

(30) Foreign Application Priority Data
Jul. 8, 2004   (KR)   ............ 10-2004-0052975

(51) Int. Cl.
*G01J 4/00* (2006.01)
*H04B 1/46* (2006.01)
*G01R 19/00* (2006.01)
*G01R 33/02* (2006.01)

(52) U.S. Cl. .............. 356/369; 455/80; 324/76.11; 324/244.1

(58) Field of Classification Search ........... 455/80; 324/76.11, 244.1; 356/369
See application file for complete search history.

(56) References Cited

U.S. PATENT DOCUMENTS 4,034,377 A * 7/1977 Knox et al. .............. 455/80
4,952,014 A * 8/1990 Lieberman et al. ...... 324/244.1

* cited by examiner

Primary Examiner—Layla G. Lauchman
Assistant Examiner—Iyabo S Alli
(74) Attorney, Agent, or Firm—Nixon & Vanderhye PC

(57) ABSTRACT

A method and apparatus for measuring a circularly polarized rotating electromagnetic wave using a magnetic field are provided. The method and apparatus are used to measure properties of a circularly polarized rotating electromagnetic wave occurring in nature by using a phenomenon that energy is intensified or attenuated when circularly polarized rotating electromagnetic waves interact. The method and apparatus are used to measure properties of a circularly polarized rotating electromagnetic wave which causes variations in a magnetic field, when circularly polarized rotating electromagnetic waves are radiated into a magnetic field formed by a magnetic body or the flow of electric current, and the variations in the magnetic field are measured as variations in electric current. The method includes the steps of: forming a magnetic field with a permanent magnet or an electromagnet; radiating a circularly polarized rotating electromagnetic wave into the magnetic field; and measuring variations in the magnetic field. The method is also used to measure properties of the circularly polarized rotating electromagnetic wave using a property of the left-circularly polarized rotating electromagnetic wave directing from the S-pole to the N-pole and a property of the right-circularly polarized rotating electromagnetic wave directing from the N-pole to the S-pole. The apparatus includes a magnetic flux meter for measuring variations in the magnetic field caused by the circularly polarized rotating electromagnetic wave radiated from a circularly polarized rotating electromagnetic wave generating source; and a current meter for measuring variations in electric current caused by variations in the magnetic field to thereby measure properties of the circularly polarized rotating electromagnetic wave. Accordingly, the method and apparatus can be used to effectively and simply measure properties of circularly polarized rotating electromagnetic waves existing in nature.

4 Claims, 5 Drawing Sheets

METHOD AND APPARATUS FOR MEASURING CIRCULARLY POLARIZED ROTATING ELECTROMAGNETIC WAVE USING MAGNETIC FIELD

BACKGROUND OF THE INVENTION

This application claims the priority of Korean Patent Application No. 10-2004-0052975, filed on Jul. 8, 2004, in the Korean Intellectual Property Office, the disclosure of which is incorporated herein in its entirety by reference.

1. Field of the Invention

The present invention relates to a method and apparatus for measuring a circularly polarized rotating electromagnetic wave using a magnetic field, and more particularly, to a method and apparatus for measuring properties of a circularly polarized rotating electromagnetic wave occurring in nature using a phenomenon that energy is intensified or attenuated when the same or different kinds of circularly polarized rotating electromagnetic waves interact.

2. Description of the Related Art

Electromagnetic waves are synthetic waves produced by an electric field and a magnetic field, which are generated by electricity. Electromagnetic waves are generated by electric appliances or devices which are widely used in our periphery. In an electromagnetic wave, an electric field extends vertically in space and is represented in units of volts per meter (V/m), and a magnetic field extends horizontally in space and is represented in units of miligauss (mG).

Electromagnetic waves are classified into a home-use power frequency of 50 Hz or 60 Hz, an extremely low frequency of 0 to 1 kHz, a low frequency of 1 to 500 kHz, a communication frequency of 500 kHz to 300 MHz, and a microwave range of 300 MHz to 300 GHz, according to frequency, that is, the number of oscillations per second. Infrared rays, visible rays, ultraviolet rays, X-rays, and gamma rays have increasingly high frequencies. When the human body is exposed to extremely low frequency and low frequency electromagnetic radiation which is generated by an electric field and a magnetic field for a long time, the temperature of the human body is changed, and thus a bio-rhythm is unbalanced, and, accordingly, may result in a disease. Also, according to the results of research, the low and extremely low frequency radiation may reduce the sperm count of men, and cause an irregular physiological phenomenon and the birth of a deformed child for women. Also, in severe cases, brain cancer can result. Accordingly, the WHO (World Health Organization) has investigated the harmfulness of electromagnetic waves and provoked people's attention.

However, research into the harmfulness of electromagnetic waves is not concluded, and it is recommended to stay away from an electromagnetic wave generation source.

Electromagnetic waves are classified into gamma rays, X-rays, ultraviolet rays, visible rays, radio waves such as ultra-sonic waves, high frequency waves, low frequency waves, and extremely low frequency waves, in order of decreasing frequency. Here, radio waves have a frequency of 3,000 GHz, that is, three trillion oscillations per second, or less. Radio waves are used for various purposes and are essential for our ordinary lives.

Electric energy can be defined as the energy of electrons flowing through conductive wires. According to recent research, it has been disclosed that electric energy is generated by circularly polarized rotating electromagnetic waves and the oscillation of electrons.

The circularly polarized rotating electromagnetic wave can be used to analyze electric energy using a different concept from existing other electric energy analysis methods. The principle of circularly polarized rotating electromagnetic wave generation is as follows. Since low frequency electromagnetic waves have minute kinetic energy, they cannot be detected by humans. When electromagnetic radiation collides with matter in free space, the matter may generate visible rays to release the energy obtained from the electromagnetic radiation. Aerial nutritional particles receive electromagnetic waves at a resonant frequency and enter an excited state, and then produce visible rays to return to a base state thereafter. When colored light of various wavelengths combines and travels along a plane, a reflective wavelength and an absorbent wavelength reflected and absorbed by particles in air intersect each other. Color waves are produced using a principle of wavelength energy generated when energy emits whenever light moves according to the kind of visible rays and collides with particles in a free space. The wavelength energy is produced to mitigate a tension of general nutritional components or aerial particles in the air, and is transferred through an oscillation process by a resonant phenomenon in the air. When color light having different wavelengths gets joined together and irradiated on a plane, a reflective wavelength and an absorbent wavelength cross-sect together. In this case, a circularly polarized rotating electromagnetic wave with a long wavelength, such as an ultrasonic wave, produces dry wave energy and neutralized wave energy.

The circularly polarized rotating electromagnetic waves are electromagnetic waves which perform a certain rotational movement. The circularly polarized rotating electromagnetic waves are produced by, for example, crystallization π-coupling when atoms are coupled. The crystallization π-coupling causes a thermal ray to change to a circularly polarized rotating electromagnetic wave. Crystallization π-coupling materials are found in, for example, alum rock or yellow soil, and it is known that these materials emit electromagnetic waves helpful to the human body. Thus, crystallization π-coupling materials are used in bathrooms, beds, alum water pipes, clothes, and architecture materials. For example, clothes having many crystallization π-coupling materials change harmful circularly polarized rotating electromagnetic waves contacting the surface of the clothes into beneficial circularly polarized rotating electromagnetic waves, thereby removing the harmfulness of the circularly polarized rotating electromagnetic waves.

Also, the crystallization π-coupling can convert a strong visible ray into a circularly polarized rotating electromagnetic wave, thus producing much absorption energy. The absorption energy is used to cure cancer and delay the growth of cancer cells. The circularly polarized rotating electromagnetic waves which are produced by the crystallization π-coupling can sterilize harmful microbes, and thus can be applied to industries in which sterilization is necessary, such as water pipe fabrication. Also, the circularly polarized rotating electromagnetic waves which are produced by the crystallization π-coupling can be applied to soup, detergent, soles of shoes, or cosmetics. It is regarded that this is because the crystallization π-coupling converts heat emitted from the human body into circularly polarized rotating electromagnetic waves beneficial to the human body. The circularly polarized rotating electromagnetic waves have been applied to oriental and other medical field or medicines. Since circularly polarized rotating electromagnetic waves can be beneficial to the human body, they are regarded as a source of bio-energy or spirits which in oriental medical science.

In a conventional method of measuring circularly polarized rotating electromagnetic waves, infrared rays (heat rays) derived from the circularly polarized rotating electromagnetic wave are measured to thus measure the rate of generation of circularly polarized rotating electromagnetic waves from heat rays, or to measure a sterilization capability.

Examples of using circularly polarized rotating electromagnetic waves are presented in: Hung Kuk Oh, "π-ray physics", 2001, The Ajou University Press, ISBN. NO. 89-86161-14-1-93420.

Also, an O-ring test (fingers force tester), a quantum resonance spectrometer, meridian, and a quantum fractal auto focusing analyser are disclosed in Hung Kuk Oh, "Some comments on implosion and Brown gas", J. Mater. Process. Technol., 95(1999), 8-9; Hung Kuk Oh, "Vortex of electrons π-bonding of atoms and superconduction", J. Mater. Process. Technol., 74(1-3)(1998) 126-130; and Hung Kuk Oh, "Some observations on the cavity of creation for cold fusion and the generation of heat", J. Mater. Process. Technol., 94(1999) 60-65).

Also, NMR is disclosed in Hung Kuk Oh, "Conventional metallic bonding and three-dimensional crystallizing π-bonding", J. Mater. Process. Technol., 94(1999) 60-65; and W. J. Gullick et al, "Three dimensional structure of the transmembrane region of the proto-oncogenic and oncogenic forms of the neu protein", EMBO J. 11(1)1992, 43-48.

However, the above-described conventional methods have problems in that measured values of the circularly polarized rotating electromagnetic wave may not be reproduced or measuring instruments are somewhat complicated. Also, the lack of reproduction of the measured values has not been explained scientifically. The present inventor has found that when the emission of circularly polarized rotating electromagnetic waves surrounding a material to be measured is induced, the emitted circularly polarized rotating electromagnetic waves can be converted into linearly polarized rotating electromagnetic waves to then measure an amount of energy as data which can be reproduced.

Color wavelength energy of circularly polarized rotating electromagnetic waves according to color light and angle has not been systematically studied yet. Also, there have been no products or applications which allow a user to easily use the color wavelength energy. Thus, most people cannot use natural energy sufficiently.

SUMMARY OF THE INVENTION

The present invention provides a method of measuring properties of a circularly polarized rotating electromagnetic wave in which variations in a magnetic field formed by a magnetic body or the flow of electric current occur when a circularly polarized rotating electromagnetic wave is radiated into the magnetic field, and the variations in the magnetic field are measured as variations in electric current.

The present invention also provides an apparatus for measuring properties of a circularly polarized rotating electromagnetic wave in which variations in a magnetic field formed by a magnetic body or the flow of electric current occur when a circularly polarized rotating electromagnetic wave is radiated into the magnetic field, and the variations in the magnetic field are measured as variations in electric current.

According to an aspect of the present invention, there is provided a method of measuring properties of a circularly polarized rotating electromagnetic wave, the method comprising: forming a magnetic field with at least one of a permanent magnet and an electromagnet; radiating a circularly polarized rotating electromagnetic wave generated by a circularly polarized rotating electromagnetic wave generating source to be measured into the magnetic field; and measuring variations in the magnetic field based on variations in an electric current to thereby detect properties of the circularly polarized rotating electromagnetic wave.

According to another aspect of the present invention, there is also provided an apparatus for measuring properties of a circularly polarized rotating electromagnetic wave, the apparatus comprising: at least one of a permanent magnet and an electromagnet forming a magnetic field; a magnetic flux meter for measuring variations in a magnetic field caused by a circularly polarized rotating electromagnetic wave radiated from a circularly polarized rotating electromagnetic wave generating source into the magnetic field; and a current meter for measuring variations in an electric current caused by the variations in the magnetic field to thereby detect properties of the circularly polarized rotating electromagnetic wave.

Also, the present invention measures properties of left- and right-circularly polarized rotating electromagnetic waves radiated from the circularly polarized rotating electromagnetic wave generation source to be measured using a property that the left-circularly polarized rotating electromagnetic wave travels from the S-pole to the N-pole and the right-circularly polarized rotating electromagnetic wave travels from the N-pole to the S-pole.

According to another aspect of the present invention, there is provided a method of measuring a circularly polarized rotating electromagnetic wave using a principle of circularly polarized rotating electromagnetic waves which is a concept of electric energy, the method comprising the steps of: using an electric current measuring apparatus to measure variations in electric current caused by a circularly polarized rotating electromagnetic wave which is absorbed by directly contacting a coil of the electric current measuring apparatus or an electric current sensor; and judging whether the circularly polarized rotating electromagnetic wave is a left-circularly polarized rotating electromagnetic wave or a right-circularly polarized rotating electromagnetic wave according to an increase or decrease in the electric current.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A configuration and operation of a method and apparatus for measuring properties of a circularly polarized rotating electromagnetic wave using a magnetic field, according to a preferred embodiment of the present invention will be described in detail with reference to the accompanying drawings.

Figure 1:
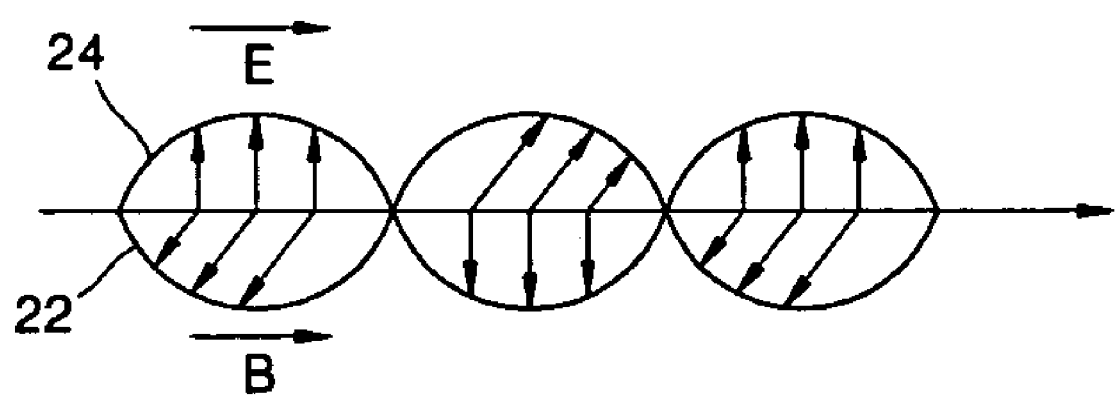
FIG. 1 is a waveform diagram of a linearly polarized rotating electromagnetic wave.

FIG. 1 is a waveform diagram of an electromagnetic wave which is applied to the present invention. A circularly polarized rotating electromagnetic wave can take the form shown in FIG. 1, and includes a magnetic field component 22 and an electric field component 24, which are perpendicular to each other.

Figure 2A:
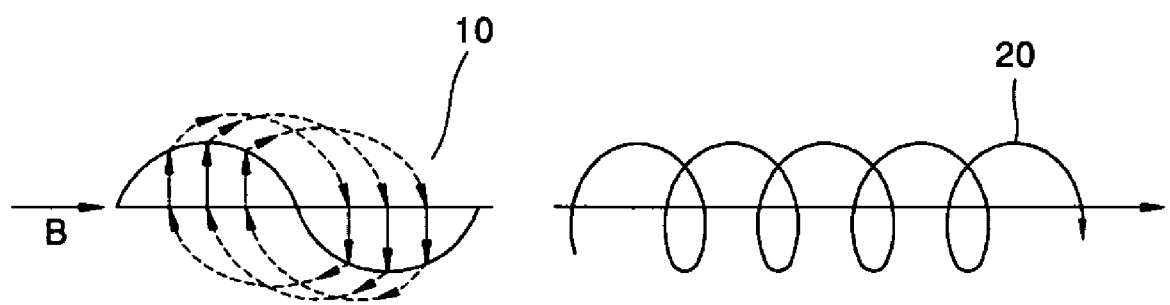
FIGS. 2A and 2B are waveform diagrams of left- and right-circularly polarized rotating electromagnetic waves, respectively.
Figure 2B:
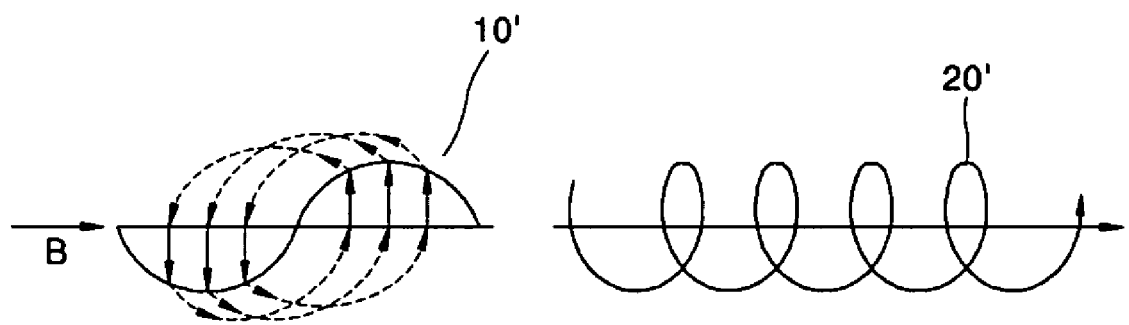
Figure 3A:
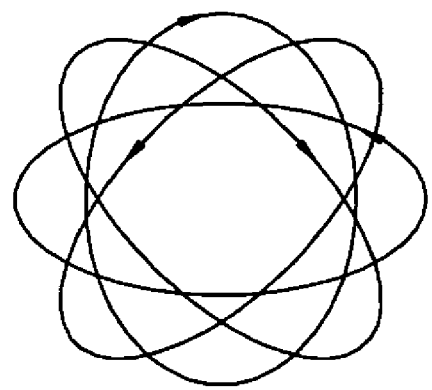
FIGS. 3A and 3B are a perspective view and a plan view for explaining a circularly polarized rotating electromagnetic wave at a fixed point, respectively.
Figure 3B:
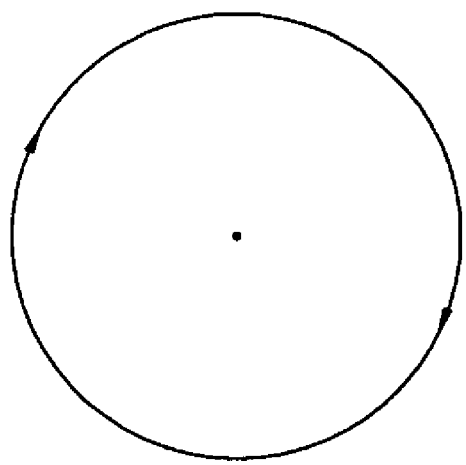

A principle of generating a circularly polarized rotating electromagnetic wave in the present invention will be described with reference to FIGS. 2A, 2B, 3A and 3B. FIGS. 2A and 2B are waveform diagrams of left- and right-circularly polarized rotating electromagnetic waves, respectively, and FIGS. 3A and 3B are a perspective view and a plan view for explaining a circularly polarized rotating electromagnetic wave at a fixed point, respectively. Circularly polarized rotating electromagnetic waves are classified into right-circularly polarized rotating electromagnetic waves which advance (20) and rotate clockwise (10'), left-circularly polarized rotating electromagnetic waves which advance (20') and rotate counterclockwise (10'), as shown in FIGS. 2A and 2B, and circularly polarized rotating electromagnetic waves which rotate at a fixed point as shown in FIGS. 3A ad 3B. When two identical electromagnetic waves out of phase with each other are parallel to each other and travel close to each other, neighbouring magnetic field lines which approach each other are dispersed and return to their original paths to thereby form closed curves of the magnetic field lines. Here, each electromagnetic wave exhibits magnetism, and thus left- and right-circularly polarized rotating electromagnetic waves 20 and 20' are produced. Since the magnetic poles of the thus-produced left- and right-circularly polarized rotating electromagnetic waves oppose each other, they attract each other. Therefore, the electromagnetic waves move close together.

Figure 4:
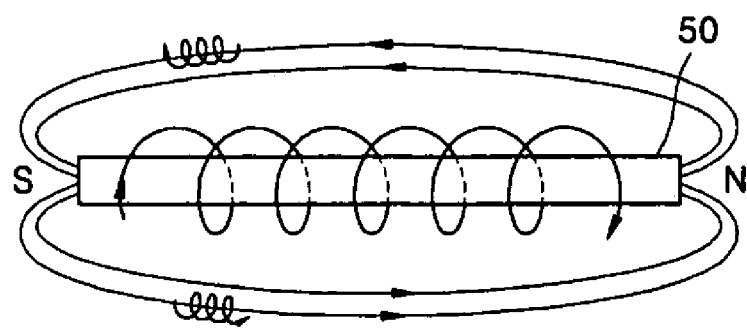
FIG. 4 is a conceptual view showing a concept of measuring left- and right-circularly polarized rotating electromagnetic waves according to the present invention.

FIG. 4 is a conceptual view showing a concept of measuring left- and right-circularly polarized rotating electromagnetic waves according to an embodiment of the present invention. The present invention uses the phenomenon that variations in a magnetic field occur when circularly polarized rotating electromagnetic waves are radiated into the magnetic field. That is, variations in a magnetic field are measured as variations in electric current to thereby measure properties of the radiated circularly polarized rotating electromagnetic waves.

Referring to FIG. 4, the present invention uses a permanent magnet or an electromagnet in order to form a magnetic field. In the present embodiment, a coil is wound around a permanent magnet 50. An electric power source is connected to both ends of the coil, to thus form an electromagnet. If current is supplied to the coil via the coil end on the left side of the permanent magnet as shown in FIG. 4, the left side of the permanent magnet becomes the S-pole and the right side of the permanent magnet becomes the N-pole. Here, the left-circularly polarized rotating electromagnetic waves which are generated in nature advance in a direction opposing in the magnetic field formed by the electromagnet, and the right-circularly polarized rotating electromagnetic waves which are generated in nature advance in the same direction as the magnetic field formed by the electromagnet. Polarization of the circularly polarized rotating electromagnetic waves can be analyzed by using the properties of the circularly polarized rotating electromagnetic waves in the magnetic field.

Figure 5:
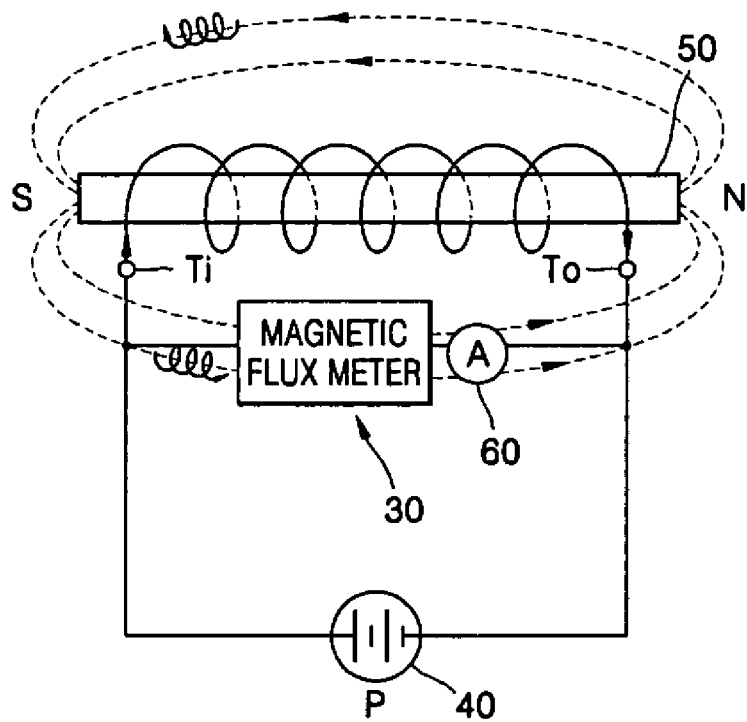
FIG. 5 is a schematic diagram of an apparatus for measuring a circularly polarized rotating electromagnetic wave using a magnetic field according to an embodiment of the present invention.

Referring to FIG. 5, in an embodiment of the present invention, properties of circularly polarized rotating electromagnetic waves are measured using the properties of the circularly polarized rotating electromagnetic waves in the magnetic field.

Figure 6:
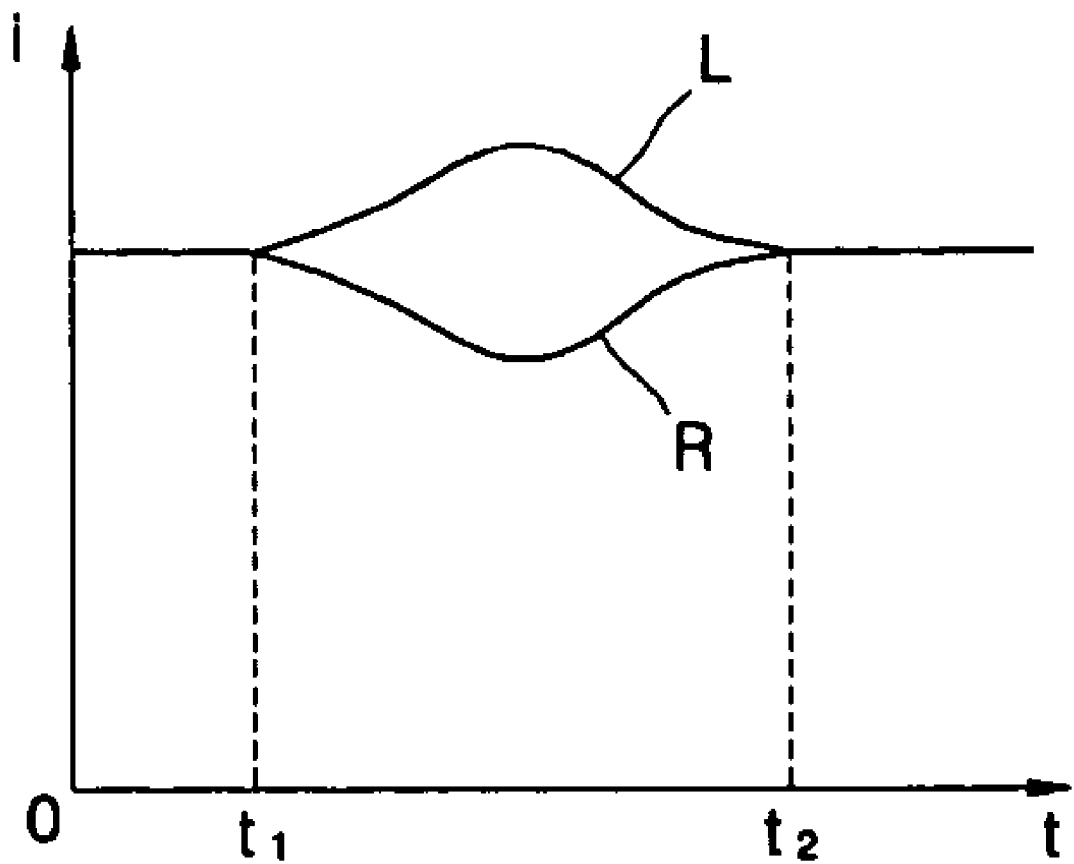
FIG. 6 is a graph illustrating variations in electric current according to variations in a magnetic field when left- and right-circularly polarized rotating electromagnetic waves are radiated into a magnetic field according to an embodiment of the present invention.

FIG. 5 is a schematic diagram of an apparatus for measuring a circularly polarized rotating electromagnetic wave using a magnetic field according to an embodiment of the present invention, and FIG. 6 is a graph illustrating variations in electric current according to variations in a magnetic field when left- and right-circularly polarized rotating electromagnetic waves are radiated into the magnetic field according to an embodiment of the present invention.

In FIG. 5, the apparatus for measuring a circularly polarized rotating electromagnetic wave using a magnetic field according to an embodiment of the present invention forms a magnetic field by supplying current from an electric power source 40 to a coil wound around a permanent magnet 50. Here, the intensity of the magnetic field is measured by a magnetic flux meter 30, and the electric current is measured by a current meter 60. When the circularly polarized rotating electromagnetic wave measuring apparatus approaches a circularly polarized rotating electromagnetic wave generation source (not shown) to be measured, the circularly polarized rotating electromagnetic wave generated by the circularly polarized rotating electromagnetic wave generation source is irradiated into the magnetic field formed by the electromagnet, thereby causing a variation in the magnetic field. The variation in the magnetic field is measured by the magnetic flux meter 30. At this time, an amount of electric current induced by the variation of the magnetic flux is measured by the current meter 60 to thereby measure properties of the radiated circularly polarized rotating electromagnetic wave.

This is performed using the property that energy is amplified or attenuated when a circularly polarized rotating electromagnetic wave is radiated into and interacts with a magnetic field. That is, a variation in the magnetic field due to radiation of the circularly polarized rotating electromagnetic wave into the magnetic field is measured as a variation of electric current to thereby measure properties of the circularly polarized rotating electromagnetic wave.

Also, the apparatus of the present embodiment measures right- and left-circularly polarized rotating electromagnetic waves which are generated in nature using the property that the left-circularly polarized rotating electromagnetic waves advance from the S-pole to the N-pole and the right-circularly polarized rotating electromagnetic waves advance from the N-pole to the S-pole. Referring to FIG. 6, a left-circularly polarized rotating electromagnetic wave attenuates the intensity of the magnetic field produced by the circularly polarized rotating electromagnetic wave measuring apparatus of FIG. 5, and thus the electric current "L"

slightly increases when the left-circularly polarized rotating electromagnetic wave is radiated into the magnetic field, while a right-circularly polarized rotating electromagnetic wave increases the intensity of the magnetic field and thus the electric current "R" slightly decreases when the right-circularly polarized rotating electromagnetic wave is radiated into the magnetic field.

While the present invention has been particularly shown and described with reference to exemplary embodiments thereof, it will be understood by those of ordinary skill in the art that various changes in form and details may be made therein without departing from the spirit and scope of the present invention as defined by the following claims.

For example, in the above-described embodiment, a circularly polarized rotating electromagnetic wave is radiated into a magnetic field formed by an electromagnet, and then a variation of electric current depending on a variation in the magnetic field is measured. It is apparent to one who has an ordinary skill in the art that the present invention can be applied to a circularly polarized rotating electromagnetic wave measuring apparatus which analyzes circularly polarized rotating electromagnetic waves generated by an unknown circularly polarized rotating electromagnetic wave generating source or generated in nature using circularly polarized rotating electromagnetic wave generation sources having previously known standard properties, and thus the detailed description thereof will be omitted.

Also, a magnetic flux meter and a current meter which are used in the present invention can be a general magnetic flux meter and a general current meter. Thus, the detailed description thereof will be omitted. However, a differential amplifier or integrator can be used in order to measure a variation in a magnetic field, that is, to measure electric current according to an increase or decrease in a magnetic field. Also, the electric power source 40 can be a direct-current (DC) source or an alternating-current (AC) source, but a DC source is used in the embodiment described herein in order to produce a constant magnetic field.

For example, in a circularly polarized rotating electromagnetic wave measuring method according to an embodiment of the present invention, a circularly polarized rotating electromagnetic wave is measured using the principle of circularly polarized rotating electromagnetic waves, which is a concept of electric energy, that a circularly polarized rotating electromagnetic wave can be determined to be a left-circularly polarized rotating electromagnetic wave or a right-circularly polarized rotating electromagnetic wave according to an increase or decrease in an electric current in a current measurement apparatus. This can be done by allowing the circularly polarized rotating electromagnetic wave to be absorbed by directly contacting a coil of the current measurement apparatus or by directly contacting a current sensor.

As described above, the circularly polarized rotating electromagnetic wave measuring method and apparatus according to the present invention can effectively and simply measure properties of circularly polarized rotating electromagnetic waves existing in nature.

What is claimed is:

1. A method of measuring properties of a circularly polarized rotating electromagnetic wave, the method comprising the steps of:
   forming a magnetic field with at least one of a permanent magnet and an electromagnet;
   radiating a circularly polarized rotating electromagnetic wave generated by a circularly polarized rotating electromagnetic wave generating source to be measured into the magnetic field; and
   measuring variations in the magnetic field based on variations in an electric current to thereby detect properties of the circularly polarized rotating electromagnetic wave, wherein it is judged whether the electromagnetic wave radiated by the circularly polarized rotating electromagnetic wave generation source is a left- or right-circularly polarized rotating electromagnetic wave according to variations in an electric current due to variations in the magnetic field, using a property that the left-circularly polarized rotating electromagnetic wave travels from the S-pole to the N-pole and the right-circularly polarized rotating electromagnetic wave travels from the N-pole to the S-pole.

2. The method of claim 1, wherein it is judged whether the radiated circularly polarized rotating electromagnetic wave is a left-circularly polarized rotating electromagnetic wave or a right-circularly polarized rotating electromagnetic wave according to an increase or decrease in the flux of the magnetic field formed by the at least one of the permanent magnet and electromagnet, and the locations of the S-pole and N-pole of the at least one of the permanent magnet and electromagnet.

3. An apparatus for measuring properties of a circularly polarized rotating electromagnetic wave, the apparatus comprising:
   at least one of a permanent magnet and an electromagnet forming a magnetic field;
   a magnetic flux meter for measuring variations in a magnetic field caused by a circularly polarized rotating electromagnetic wave radiated from a circularly polarized rotating electromagnetic wave generating source into the magnetic field; and
   a current meter for measuring variations in an electric current caused by the variations in the magnetic field to thereby detect properties of the circularly polarized rotating electromagnetic wave, wherein it is judged whether the electromagnetic wave radiated by the circularly polarized rotating electromagnetic wave generation source is a left- or right-circularly polarized rotating electromagnetic wave according to variations in an electric current of the current meter due to variations in the magnetic field of the magnetic flux meter, using a property that the left-circularly polarized rotating electromagnetic wave travels from the S-pole to the N-pole and the right-circularly polarized rotating electromagnetic wave travels from the N-pole to the S-pole.

4. A method of measuring a circularly polarized rotating electromagnetic wave using a principle of circularly polarized rotating electromagnetic waves which is a concept of electric energy, the method comprising the steps of:
   using an electric current measuring apparatus to measure a variation in electric current caused by a circularly polarized rotating electromagnetic wave which is absorbed by directly contacting a coil of the electric current measuring apparatus or an electric current sensor; and
   judging whether the circularly polarized rotating electromagnetic wave is a left-circularly polarized rotating electromagnetic wave or a right-circularly polarized rotating electromagnetic wave according to an increase or decrease in the electric current.

* * * * *